United States Patent
Bohnet et al.

(10) Patent No.: US 9,508,542 B2
(45) Date of Patent: Nov. 29, 2016

(54) ARRANGEMENT FOR THE PRODUCTION OF STRUCTURED SUBSTRATES

(71) Applicant: RUMAILHA-COMÉRCIO INTERNACIONAL E SERVICOS LDA & COMANDITA, Funchal (PT)

(72) Inventors: Hans Bohnet, Schoemberg (DE); Klaus-Peter Thiel, Fischbachtal (DE)

(73) Assignee: Rumailha-Comercio Internacional e Servicos LDA & Comandita, Madeira (PT)

(*) Notice: Subject to any disclaimer, the term of this patent is extended or adjusted under 35 U.S.C. 154(b) by 0 days.

(21) Appl. No.: 13/888,499

(22) Filed: May 7, 2013

(65) Prior Publication Data
US 2013/0239883 A1 Sep. 19, 2013

Related U.S. Application Data

(63) Continuation of application No. PCT/DE2011/001940, filed on Nov. 7, 2011.

(30) Foreign Application Priority Data

Nov. 7, 2010 (DE) .................. 20 2010 015 018 U

(51) Int. Cl.
*H01L 21/02* (2006.01)
*G03F 7/30* (2006.01)
(Continued)

(52) U.S. Cl.
CPC ......... *H01L 21/02104* (2013.01); *B05C 11/08* (2013.01); *B05C 11/1039* (2013.01);
(Continued)

(58) Field of Classification Search
CPC ... B05C 13/02; B05C 11/1039; B05C 11/08; H01L 21/02104; G03F 7/162; G03F 7/3092; G03F 7/3021
USPC ........... 118/600, 602, 603, 610, 52, 56, 319, 118/320; 134/111, 902
See application file for complete search history.

(56) References Cited

U.S. PATENT DOCUMENTS 5,766,359 A * 6/1998 Sichmann et al. ............ 118/603
6,159,541 A 12/2000 Sakai et al.
(Continued)

FOREIGN PATENT DOCUMENTS

EP 0 403 086 B1 2/1996
EP 1 577 930 A1 9/2005

OTHER PUBLICATIONS

International Preliminary Report on Patentability for Application No. PCT/DE2011/001940 dated May 8, 2013 with English translation.

*Primary Examiner* — Laura Edwards
(74) *Attorney, Agent, or Firm* — Muncy, Geissler, Olds & Lowe, P.C.

(57) ABSTRACT

An arrangement for producing structured substrates is provided, which includes a device for applying layer systems including a device for applying liquid materials to rotating substrates, a housing, a rotating holder for the substrate to be coated, a feeder for liquid materials to be applied, and a collection device having multiple removal contraptions for liquid materials that do not remain on the substrate. The housing of the device is filled with an inert gas, in particular dried, molecular nitrogen, noble gas, or a mixture thereof. The additional receptacles and conduits of the arrangement for producing structured substrates are gas-tight and are designed such that an inert molecular nitrogen or noble gas atmosphere is created above the liquid contents thereof. The collection device has various collection zones in which different liquid materials can be selectively collected and selectively removed via the associated removal contraption.

16 Claims, 2 Drawing Sheets

(51) Int. Cl.
  *B05C 13/02* (2006.01)
  *B05C 11/10* (2006.01)
  *B05C 11/08* (2006.01)
  *G03F 7/16* (2006.01)
  *H01L 21/67* (2006.01)

(52) U.S. Cl.
  CPC ............... *B05C13/02* (2013.01); *G03F 7/162* (2013.01); *G03F 7/3021* (2013.01); *G03F 7/3092* (2013.01); *H01L 21/6708* (2013.01); *H01L 21/67051* (2013.01)

(56) References Cited

U.S. PATENT DOCUMENTS

| | | | |
|---|---|---|---|
| 6,863,019 B2* | 3/2005 | Shamouilian et al. | 118/723 R |
| 2004/0050491 A1* | 3/2004 | Miya et al. | 156/345.11 |
| 2007/0254098 A1* | 11/2007 | Ko et al. | 427/240 |

* cited by examiner

ARRANGEMENT FOR THE PRODUCTION OF STRUCTURED SUBSTRATES

This nonprovisional application is a continuation of International Application No. PCT/DE2011/001940, which was filed on Nov. 7, 2011, and which claims priority to German Patent Application No. DE 20 2010 015 018.3, which was filed in Germany on Nov. 7, 2010, and which are both herein incorporated by reference.

BACKGROUND OF THE INVENTION

1. Field of the Invention

The present invention relates to an arrangement for producing structured substrates. This type of arrangement for producing structured substrates is employed in the production of integrated circuits.

2. Description of the Background Art

The typical production process for integrated circuits employs one or more photolithographic steps to define patterns on the surface of a substrate, particularly a silicon wafer. Said patterns are used in subsequent steps to provide a plurality of elements, which together form the active components and bonding circuitry of an integrated circuit.

The substrate is normally disk-shaped. A checkerboard pattern of square or rectangular chips on the substrate is formed by lines along which the chips can be separated as soon as the processing steps being performed on the substrate have ended.

Conventional photolithography comprises a number of well-known steps. In this respect, the substrate is placed in a coating device with a chuck. Then, the top substrate surface on which the circuit features are to be formed is cleaned by a liquid solvent. The solvent can include a suitable bonding agent to facilitate the adhesion of a photopolymer layer, which is applied subsequently to the substrate surface.

As the next step, the chuck is operated to rotate the substrate. This rotation throws off excess solvent until the substrate surface appears to be dry. The chuck is then turned off. After the substrate has ceased to move, a predefined amount of a photopolymer solution is applied to the substrate surface. Next, the chuck is operated to distribute the liquid photopolymer solution on the substrate surface.

As soon as the photopolymer solution has dried, it is selectively exposed to light either by using a mask or by using a direct write technique in order to structure each chip in accordance with the desired configurations of a layer of the overall layout of the integrated circuit design. Subsequent steps such as, for example, etching, doping, oxidizing, or different deposition steps are carried out with use of these and subsequently formed and patterned photopolymer layers.

Many different factors can disadvantageously influence the quality, uniformity, and reliability of the photolithographic techniques as they are used in known production processes for integrated circuits. These factors include the materials, techniques, and conditions for the application of liquid materials, particularly photopolymer solutions. Ideally, the formed photopolymer layer is of such quality that a precise photoreproduction of all microscopic details of the mask is made possible initially in the photopolymer layer, also called the photoresist layer, and then in the physical circuit elements to be formed with use of said photopolymer layer.

All physical, chemical, and environmental factors must be carefully controlled, so that none of the structuring steps with respect to a substrate or the proportions of the individual chips fail. Sometimes, individual factors alone cannot be sufficient to cause problems, but in combination they disadvantageously influence the quality particularly of the photopolymer layer and then the quality of the resulting circuit elements.

European patent EP 0 403 0 086 B1, which corresponds to U.S. Pat. No. 7,864,303, discloses an arrangement for producing structured substrates.

Known coating equipment has the problem that the different liquid materials, particularly the photopolymer solutions, are applied in such large amounts that there are considerable surpluses which cannot be used further in view of the quality.

SUMMARY OF THE INVENTION

It is therefore an object of the present invention to provide an arrangement for producing structured substrates by which the amounts of the necessary liquid materials are reduced and thereby the quality of the photolithographic production process is appreciably improved.

The inventive arrangement for producing structured substrates has a device for applying layer systems to a substrate, which has a closed chamber in which the liquid materials for forming the layer system are applied. The liquid materials, particularly the photopolymer solutions, which are used within the scope of the photolithography process whether for cleaning or for forming the photopolymer layer, also called the photoresist layer, are of particular importance here.

The circular substrate is placed in a rotating holder, often called a chuck, and the liquid material, particularly the photopolymer solution, is applied to it via a feed either in the static or dynamic rotating state. The excess liquid material, particularly the photopolymer solution, is spun off the rotating substrate and removed from the closed chamber of the device for applying layer systems. For this purpose, according to the invention a collecting device is arranged around the holder, surrounding said holder, so that at least essential parts of the spun-off liquid materials are collected by said collecting device and removed selectively from it via a plurality of removal devices. In this respect, according to the invention the collecting device and the removal devices are operated in time or space, so that the various employed liquid materials can be removed in fractions as pure as possible or in batches of only a few different liquid materials. This occurs preferably by suitable temporal, particularly sequential, control of the removal and/or by suitable design, arrangement, or positioning of the collecting device.

According to the invention, the selectively removed liquid materials are reintroduced into the process for preparing structured substrates either directly or after minor preparation, whereby there is a considerable reduction in environmental pollution together with a considerable savings potential.

According to the invention, the device for applying layer systems is realized with a housing, which makes it possible to fill the closed chamber for applying liquid materials, i.e., the volume, in which the rotating substrate is arranged, as well as the feed and removal devices with an inert gas, by which the liquid material, particularly the photopolymer solution, is protected from contact with interfering substances in the ambient air, particularly oxygen or air moisture. In so doing, it is possible to avoid the known interfering effect of oxygen, identified according to the invention, said oxygen which in photopolymer solutions leads to an oxidation of the highly polar hydrogen bonds and converts hydroxyl groups in quinoid systems. Furthermore, it is possible to prevent interfering saponification reactions of the photopolymer solutions owing to air moisture, by which the photoinitiators lose their reactivity for photons in the following light exposure steps during the photolithographic process.

The quality of the employed liquid materials, particularly the photopolymer solutions, both before, during, and also after application is increased by this arrangement of the coating device according to the invention with a coating chamber that is filled with an inert gas; this leads to improvement of the overall process in regard to the quality of the produced chips with reduced material expenditures and cost. In this respect, the chamber for applying liquid materials need not comprise the entire interior of the housing of the device for applying layer systems.

In this respect, the housing of the device for applying layer systems is preferably gas-tight, therefore closed, particularly made of V4A steel or glass, and thereby formed so that the entire interior of the housing can be provided with a protective gas atmosphere, i.e., with an inert gas. The supplying of the substrate(s) occurs thereby preferably via a lock. Substrates that have been coated are in turn collected and removed from the device for applying layer systems via especially another lock. The use of locks makes it possible to maintain the inert atmosphere lastingly and reliably.

Duran glass, which is especially resistant to the liquid and gaseous substances used in the device and is particularly gas-tight, has proven to be an especially suitable glass for the device of the invention.

It has proven especially advantageous to dehumidify the inert gas, which is preferably molecular nitrogen or a noble gas, particularly helium, neon, or argon or a combination thereof, before use in the device for applying layer systems. This is realized preferably with the aid of a molecular sieve, which removes residual moisture in the inert gas with the aid of zeolites. A purity of 99.99999% of molecular nitrogen has proven especially advantageous, which is achieved by the use of a suitable molecular sieve. In so doing, both interfering larger molecules and the remaining residual moisture in the molecular nitrogen are retained by the zeolites in the molecular sieve.

It is assured especially by the special use of the inert gas to prevent the interfering effects of atmospheric oxygen, on the one hand, and the air moisture, on the other, that a harmful action by the air and moisture on the employed liquid materials can be prevented.

It has proven effective as an especially preferred embodiment of the invention to surround the holder in the housing of the device for applying layer systems by a ring-shaped collecting device, which is disposed in the chamber for applying liquid materials. In this respect, the ring-shaped collecting device has especially a wall which the liquid materials spun off the rotating substrate strike and then run down the wall. The collecting device has a plurality of collection zones separated from one another, whereby separating elements separate the collection zones liquid-tight. Each collection zone here is assigned a removal device by which the liquid materials that have run down the wall in the collection zone and have been collected can be removed specifically and selectively. The spun-off liquid materials can be collected by the embodiment of the invention very efficiently and selectively, without said materials mixing in an undesirable manner and thereby damaging themselves.

Spun-off liquid materials, particularly photopolymers, can be collected very efficiently by said design of the collecting device and arrangement of said device in conjunction with the inert gas filling without said materials being damaged in their effectiveness by the harmful action of the ambient atmosphere, especially atmospheric oxygen or moisture in the air. It is possible thereby to supply the liquid materials collected selectively in the collecting device, particularly the collected photopolymer solutions, without costly purification or processing steps for reuse in the device of the invention for applying layer systems.

It has proven especially advantageous to design the collecting device movable relative to the holder so that depending on the movement different collection zones for collecting spun-off liquid materials become operational. The different collection zones can become operational in different process steps by the inventive movement of the collecting device and thereby the liquid materials relevant for this process step are selectively collected and removed specifically via the selective removal device. Hereby the position of the collecting device relative to the holder is selected process-controlled, so that the liquid materials collected in a collection zone do not interfere mutually or only insignificantly and thereby straightforward reprocessing and re-use can be employed in the production of structured substrates.

In this respect, the different collection zones are configured preferably as ring-shaped channels, which extend parallel to the plane of the holder. In particular, said ring-shaped channels are realized in each case by a ring-shaped wall, which are arranged especially on a single common wall, especially shaped like a hollow cylinder or hollow cone. The distance of the ring-shaped walls, forming the separating walls, to the respective neighboring separating wall is thereby preferably constant and therefore substantially parallel. As a result, a ring-shaped channel is formed which is preferably characterized by a wedge-shaped cross section. This is achieved in that the separating walls are formed running oblique to the common wall. Preferably, the ring-shaped channel, wedge-shaped in cross section, is formed solely by the parallel separating walls and the one common wall, whereby a very compact, simple to produce, and highly functionable design of the different collection zones with removal device results.

These embodiments provide an efficient and simple movement of the collecting device relative to the holder for as selective as possible collection of the excess liquid materials. Said collecting device turns out to be also structurally very simple, not very delicate, and very reliable in its selection function. Especially after the collection of a number of different liquid materials in different channels, these are selectively removed and taken to selective storage containers via the removal device arranged in the lower area of the channel. This occurs especially by means of a separate removal device, which is realized as a pump or valve-controlled pressure line.

By means of this design especially from glass, a very effective collecting device is realized, on the one hand, and it is assured, on the other, that said collecting device is not damaged by the employed liquid materials. Apart from this, said collecting device, which is made preferably of glass or also of V4A steel, is not negatively affected by the employed inert gas in the chamber for applying liquid materials. The arrangement of the invention thereby successfully and lastingly realizes a high production quality.

The storage container for storing the liquid materials, which are realized in particular as dehumidified and degassed liquid materials, is preferably configured so that said liquid materials, especially the photopolymer solutions, are not negatively affected by harmful gases in the environment, particularly by oxygen or by air moisture. This is achieved particularly in that the storage vessel and the transport line are made of V4A steel or glass and preferably the storage vessel is configured so that an atmosphere of inert gas is disposed permanently above the supply of the liquid material. In this respect, the transport line ends preferably in the area of the liquid collection volume of the collecting device and there evacuates by means of negative pressure, which is realized in particular by a connected pump, the collected liquid materials from the collecting bowl and conveys them via the removal device and the gas-tight transport lines connected thereto into the storage containers.

From there, the liquid materials, used in the production process and collected in different storage containers separately from one another, can again be supplied to the production process in the arrangement. Optionally, said various liquid materials, collected in a storage container, are transferred to suitable reservoirs which supply the rest of the arrangement. In this respect, this transfer is made by means of especially gas-tight transport lines.

In an embodiment of the arrangement of the invention, at least one supply line is provided for the various liquid materials to the chamber for applying liquid materials. At least one of the supply lines is provided thereby with at least one degassing device and additionally especially with at least one dehumidifying device. Alternatively or in addition, it has also proven effective to provide the removal device with storage containers likewise with at least one degassing device and especially with at least one dehumidifying device. The quality of the employed liquid materials, especially of the photopolymers, is successfully kept at a high level for a longer time period and thereby the quality of the structured substrate production process is assured. It has proven especially effective, on the one hand, to provide the storage container(s) or reservoirs with a degassing device and optionally or in addition with a dehumidifying device; it is possible as a result to remove interfering gases or moisture possibly introduced into the reservoir and thereby to increase specifically the quality of the liquid materials, used to produce the structured substrates, and thereby to reduce the amount of the employed cost-intensive liquid materials. At least one storage container or at least one reservoir but preferably all are realized so that an atmosphere of inert gases, particularly of dehumidified, inert gases, is always disposed above the supply of liquid materials.

To realize a degassing device or a dehumidifying device from known options, it has proven especially effective to realize these in that in the bottom area of the storage container and/or the reservoir a flat sieve is provided, which has openings through which molecular nitrogen and/or noble gases emerge for degassing and especially for dehumidifying the liquid materials, particularly the photopolymer solutions, and then rise through the supply of the liquid materials, particularly photopolymer solutions, and thereby dissolve the other gases in the liquid materials and especially the residual moisture and remove these from the liquid materials. Next, the gases are collected with the residual moisture dissolved in the gases and pumped out. In so doing, the molecular nitrogen or noble gas, which is especially helium, neon, and/or argon or a combination thereof, before the supplying via a supply line is freed from the residual moisture present in the supplied gas with the aid of a dehumidifying step, which is formed especially as a molecular sieve containing especially zeolites. The use of purified and dehumidified gas in the reservoir for degassing and dehumidifying the liquid materials, particularly the photopolymers, succeeds in providing the liquid materials, necessary for the production process, in a high purity and quality and thereby keeping the quality of the produced structured substrates and thereby the chips high.

According to an embodiment of the coating system of the invention, the storage container like the reservoir(s) is provided with a degassing device and particularly with a dehumidifying device, whereby it is possible to free the liquid materials, especially the photopolymers, which have become contaminated with undesirable gases or moisture by the production process, from the gaseous or liquid contaminants; in analogy to the degassing or dehumidifying this occurs in the reservoir.

The quality of the liquid materials can then be determined by using viscosity measuring devices and optionally the desired viscosity can be adjusted by the addition of solvents and/or resins before they are supplied to the further production process. It has proven especially effective here to filter liquid materials removed from the collecting device, from the removal device, or from the storage container(s) by means of superfiltration through particle filters with a pore size of about 0.01 μm or less. So-called Nanoshield filters, because they are nanotube filters, have proven to be especially suitable filters here. This successfully removes extremely small interfering particles and gel particles from the liquid materials, particularly from the photopolymer solutions, and thereby keeps the quality of the liquid materials, particularly the photopolymer solutions, at a very high quality standard. This special method of the invention makes it possible to realize a quality in the sub-ppb range. In addition or alternatively, the use of molecular sieves or filters with manganese oxide and/or limonite has proven effective.

According to an embodiment of the invention, the collected liquid materials are removed from the storage containers and supplied to a vacuum distillation device. Said vacuum distillation separates the selected liquid materials into components, particularly water, solvents, and other liquid components such as coating components, which are then transferred each into assigned gas-tight containers. In so doing, the vacuum distillation occurs preferably so that the distillation temperature is kept appreciably below 70° C. This is achieved particularly in that the work is performed at a negative pressure in the range of a few mbar, particularly in the range of 10 to 20 mbar. Under these selected distillation conditions, it is possible to separate the solvents employed there reliably and successfully from the coating components, arising from the employed liquid materials, particularly the photopolymers, without these liquid materials, particularly the photopolymers, being broken down by the distillation or otherwise damaged. It is also possible to separate these from the potentially present azeotropic mixture with water, and thereby to maintain the quality of the solvents and the other liquid or solid coating components or to increase it by the separation. This enables the novel advantageous further use of the components in the process of producing structured substrates.

By this inventive embodiment of the coating device, it is possible to recycle the liquid materials, which were dissolved by the use of solvents during the application of a layer system on the substrate, and based on the inventive realization of the device to recycle them in a quality that enables the dissolved, vacuum-distilled, liquid materials, particularly the photopolymers, to be reintroduced into the production process. This occurs preferably by introduction into one of the reservoirs of the invention.

Preferably, the recycled liquid materials, particularly the photopolymers, are adjusted in their viscosity by the addition, inter alia, of resins or solvents so that they can be used efficiently and effectively in the production process. Moreover, it has proven effective to purify the liquid materials from contaminants, particularly dissolved moisture, with a molecular sieve before they are supplied to the reservoir.

Because the unwanted substances normally have a high mass value particularly in the range of 1000, the inventive use of molecular sieves for purifying the employed liquid materials, particularly the employed solvents, has proven especially effective. Costly distillations or other recycling measures can be largely omitted.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
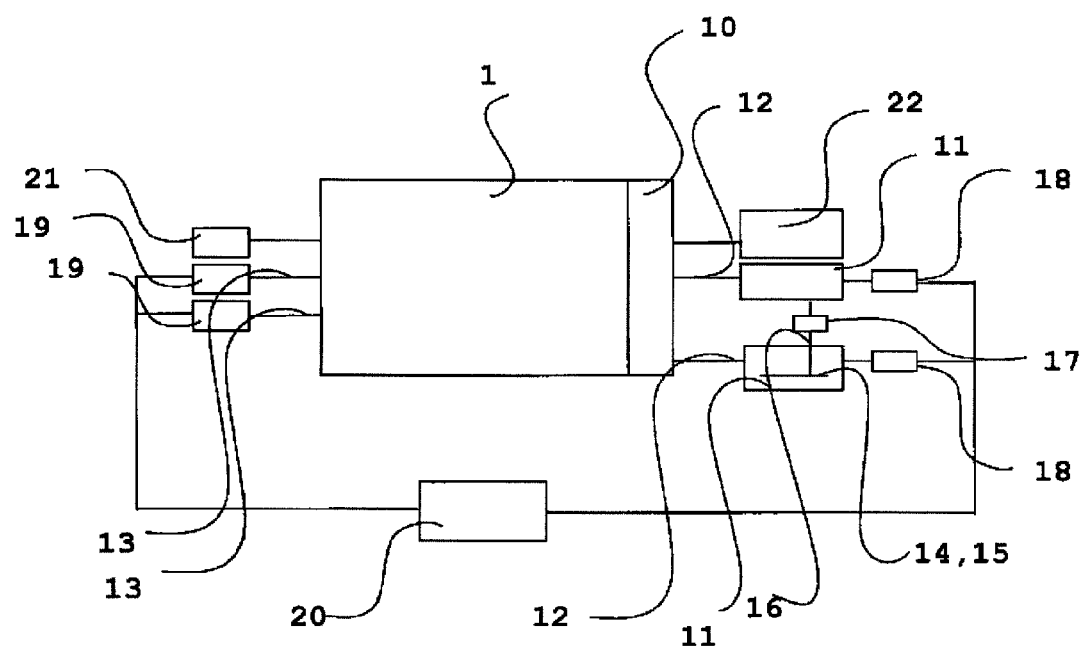
FIGS. 1 and 2 show a schematic illustration of a selected arrangement of the invention for producing structured substrates.
Figure 2:
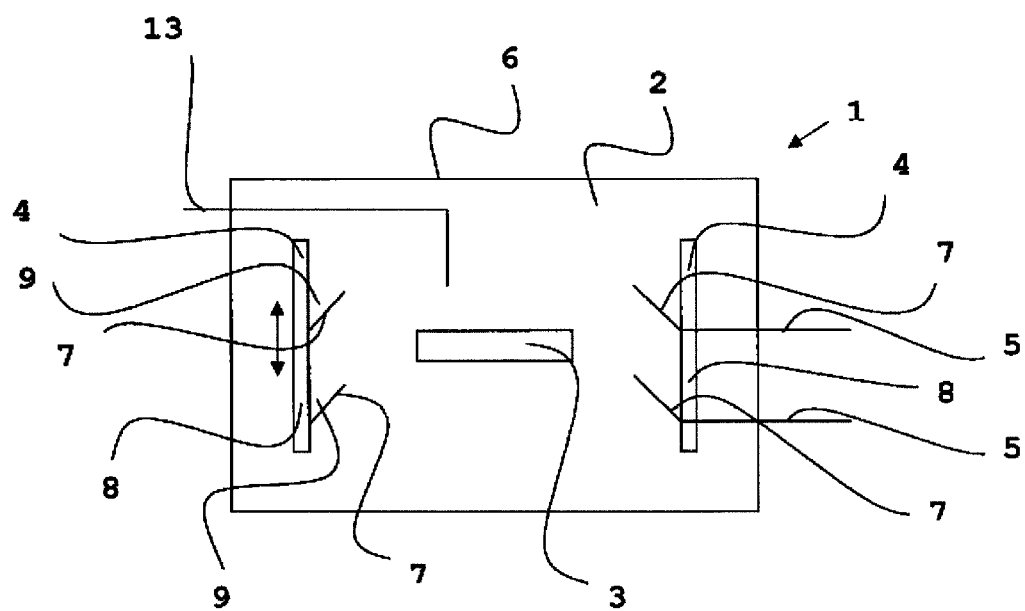

An exemplary embodiment of the invention is illustrated below in FIG. 1 and/or in FIG. 2. The invention is not limited to the realizations of the arrangement of the invention for producing structured substrates, as presented by way of example, but rather the invention also comprises solutions derived therefrom that are revealed to a person skilled in the art from the totality of the present documents with the exemplary solutions.

Apart from a plurality of other components (not shown) of the arrangement for producing structured substrates, the arrangement for producing structured substrates is a device for applying layer systems 1 as the central component of the arrangement for producing structured substrates. A holder 3 is arranged in it in closed chamber 2 for applying liquid materials, which is surrounded by housing 6 made of V4A steel and thereby gas-tight. According to the invention, an atmosphere of inert gas is present in chamber 2. If holder 3 is loaded with a substrate to be structured, to which liquid materials, for example, a photopolymer solution, are supplied via supply line 13, the photopolymer solution is distributed by rotating holder 3 over the flat, disk-shaped substrate due to the rotation of the same. The excess liquid materials such as the photopolymer solution are thereby spun off the rotating substrate.

It is possible by means of the arrangement of the device for applying layer systems 1, according to the invention, with an inert gas atmosphere to prevent damage or destruction of the supplied photopolymer solution and thereby to keep high the quality of the production process, which depends substantially on the quality of the employed solutions, particularly the photopolymer solutions. In this respect, the inert atmosphere is realized particularly by dehumidified molecular nitrogen, which prevents contact with oxygen, particularly from the ambient air, or with moisture from the ambient air.

Oxygen damages the photopolymer solution because of the oxidation of the highly polar hydrogen bonds and the conversion of the hydroxyl groups into quinoid systems. An undesirable saponification of the photopolymer solutions because of the moisture particularly from ambient air can also be successfully prevented by the selected inert atmosphere.

According to the invention, the liquid materials spun off the substrate, such as the photopolymer solution, are collected by a collecting device 4. Said collecting device 4 is made of glass. It surrounds holder 3 in the shape of a ring and is arranged in gas-tight housing 6. Collecting device 4 has the form of a hollow cylinder, whereby wall 8 of the hollow cylinder has a plurality of separating elements 7 on the inner side facing the holder; these delimit the inner wall in a ring-shaped manner and thereby form a plurality of ring-shaped channels 9. Spun-off liquid materials are collected in said channels 9; they form collection zones 9. In this case, separating elements 7, formed in the shape of a wall, are substantially parallel to one another and arranged at the same distance to one another on common wall 8. At the lower end of ring-shaped channels 9, a removal device 5 is arranged in each case by means of which the liquid materials collected in channel 9, such as photopolymer solutions, can be selectively removed. Different collection zones 9 travel into the spinning area of holder 3 by a vertical movement of collecting device 4, whereby a separation of the different liquid materials used in various process steps for producing a structured substrate is enabled in a simple and efficient way. A mutual contamination of the liquid materials is greatly reduced thereby.

After a liquid material is applied via supply line 13 by means of a nozzle onto the rotating substrate in holder 3, the excess portion of the liquid material is spun off radially from the rotating substrate by the rotation and, after it has left the substrate, strikes surrounding, ring-shaped wall 8 of collecting device 4. The liquid material then drops downward from common wall 8 into collection zone 9 formed as a ring-shaped channel 9. It is moreover assured by the parallel design of separating elements 7 for the formation of channels 9, which are wedge-shaped in cross section, that spun-off liquid materials, which do not hit wall 8 but separating element 7 above it, likewise enter ring-shaped channel 9, which is located below and is wedge-shaped in cross section, whereby the selective collection of the liquid materials in collection zones 9 located below is especially assured. In this respect, the channels are formed solely by common wall 8 and parallel separating elements 7. A very simple and easily manageable collecting device 4 is created herewith, which is formed movable relative to holder 3 which is unchangeable in its vertical position during the rotation phase.

It is possible because of the possibility of moving collecting device 4 according to the invention not to perform the removal continuously during the production process but to be able to keep repeating it at a suitable time. According to the invention it is possible hereby to selectively collect liquid materials repeatedly used in the production process and then at a later time especially at a single time to remove them via the assigned selective removal device 5. In this way it is possible to simplify the production process still further and to keep the quality of the spun-off liquid materials exceptionally high due to the considerably reduced mutual contamination in conjunction with the other protective measures such as the inert gas, degassing, or dehumidifying.

With the aid of an arrangement of reservoir 19 with a degassing and dehumidifying device and the device for applying layer systems 1 with an inert atmosphere in chamber 2 and collecting device 4 with a removal device 10 and the gas-tight storage containers 11, with degassing device 14 and dehumidifying device 15 it is achieved in particular to collect liquid materials, for example, photopolymer solutions, in storage containers 11, which correspond substantially in quality to the originally used liquid materials, for example, the photopolymer solutions, in reservoirs 19. In order to increase the quality still further, in addition before the photopolymer solution is taken from storage container 11 to reservoir 19, this solution is passed through a particle filter 18, a Nanoshield filter. An especially high level of quality of the liquid materials is assured by this realization of reservoirs 19 and storage containers 11 for the production process of structured substrates in the arrangement of the invention for producing structured substrates.

It is now also possible to realize a production process with a closed cycle for individual liquid materials, which, beginning with reservoir 19, the device for applying layer systems 1, and storage containers 11 with the associated transport and supply lines, form a closed, gas-tight, and especially an inert gas-filled system, which overall assures a very sustained high quality, for example, of the photopolymer solution. In this way, a very efficient and high-quality production process of structured substrates is assured by the arrangement of the invention.

After the coating with the photopolymer solution, a so-called edge bead removal or back flushing is performed. In so doing, areas of the coated substrate are freed from the photopolymer layer. To that end, solvents that are suitable for use as solvents for the coating formed with the photopolymer solution are used as liquid materials. In this case, PGMEA (propylene glycol monomethyl ether acetate), EL (ethyl lactate), MMP (methyl 3-methoxypropionate), or EEP (ethyl 3-ethoxypropionate) has proven to be especially advantageous.

The solvent is conveyed from a reservoir 19, which, like the other reservoirs 19 or storage containers 11, is also made of gas-tight V4A steel and is provided with a protective gas atmosphere of inert, molecular, dried nitrogen. The conveyed solvent is conveyed via a feed line to supply line 13 into the device for producing a layer system.

There, the solvent is applied specifically in the edge region of the substrate. Within the scope of this process step, the coating of the substrate, coated with the dried photopolymer solution, is partially removed and the mixture of solvent and dissolved coating is spun off into a selective collection zone 9 and then removed from device 1 via selective removal device 5. It is assured by the inert atmosphere present in device 1 that the solvent is not contaminated by interfering particles in the ambient air, particularly by oxygen or moisture, which leads to damage to the solvent or the photopolymer solution in subsequent recycling processes.

The liquid materials removed via removal device 5, after they have been introduced into storage containers 11, are subjected at least partially to a degassing by a degassing device 14. In this case, inert gases such as, e.g., dried nitrogen, dehumidified via a sieve located at the bottom of storage container 11, are introduced into the liquid materials in order to dehumidify these, on the one hand, and to degas them, on the other. The dehumidified inert gas is supplied to the sieve via a supply line 16, in which a molecular sieve 17 for dehumidifying the inert gas is disposed. The liquid material is removed from storage container 11 and supplied to a particle filter 18, which is realized as a Nanoshield filter with a pore diameter of the nanotubes in the range of 0.1 μm or particularly in the range of 0.01 μm. This assures that both the solvent and also the dissolved photopolymers can pass through easily, whereas larger complexes, particularly gel-like particles, are held back. Apart from storage container 11 and supply line 16, the other lines, particularly transport line 12, are also made gas-tight of V4A steel.

In this respect, the substrate to be structured is introduced via a supply 21 in conjunction with a lock in the device for applying layer systems 1 in order to bring it into holder 3. After structuring has been completed, the structured substrate is again removed from the device for applying layer systems 1 via another lock and brought into storage compartment 22. This design of the arrangement achieves maintaining the inert atmosphere and thereby keeping the quality of the process high and thereby the quality of the liquid materials and also the quality of the production process particularly in regard to the costs associated therewith.

To improve still further the quality and particularly the purity of the spun-off liquid materials, particularly the solvents, after the aforementioned process steps these are supplied at least partially to a vacuum distillation device 20. Said vacuum distillation device 20 operates at a temperature of about 65° C. and at a pressure of about 10 to 20 mbar. With the aid of said vacuum distillation device 20, inter alia, polymer solutions of 100 to 500 mpa·s can be successfully separated from the selectively collected liquid materials and the solvents separated in turn therefrom recovered very cleanly. Vacuum distillation device 20 has a distillation output of 500 L/h.

The solvents are then transferred to reservoir 19, whereas the photopolymer solutions are transferred separately from it to another reservoir 19, from which after adjustment of the desired viscosity, which is of particular importance for the production process of a layer system, these can again be used in the production process. The viscosity is adjusted by addition of solvents to reduce the viscosity or resins to increase the viscosity.

It has also proven effective to add up to 1% imidazole, which improves the temperature stability and the plasma etching stability of the coated substrate. It also has proven effective to add temperature-resistant nanoparticles, for example, as fullerene or ruthenium oxide with a diameter of about 25 nm, which in turn improves the temperature resistance and the resistance during plasma etching or ion implantation of the coated substrate.

By this inventive type of the realization of the arrangement for producing structured substrates, a savings rate greater than 90% for photopolymers can be achieved or a savings rate greater than 99% for the employed solvents. These solvents, as well as the photopolymers, are cost-intensive factors for the production of structured substrates, for which reason the arrangement of the invention succeeds in greatly reducing the cost for the production of structured substrates particularly through the reduction of the employed materials.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An arrangement for producing structured substrates with a device for applying layer systems to a substrate, the arrangement comprising:
   an air-tight chamber;
   at least one liquid supply line for supplying liquid materials to the air-tight chamber for applying the liquid materials to form a layer system;
   a rotating holder for substrates; and
   a collecting device surrounding the rotating holder and arranged in the air-tight chamber, the collecting device adapted to collect liquid materials spun off of the substrate,
   wherein the collecting device has at least two removal devices configured to remove the collected liquid materials selectively, individually or in batches,
   wherein the collecting device in the air-tight chamber surrounds the rotating holder annularly and has at least two collection zones separated from one another by separating elements formed on a common wall of the collecting device to collect the spun-off liquid materials,
   wherein the air-tight chamber is filled with an inert gas,
   wherein the separating elements are oriented diagonally relative to the common wall and are oriented diagonally relative to a surface of the rotating holder, and
   wherein the separating elements of the collecting device, on the side facing the rotating holder, form a plurality of ring-shaped channels, wedge-shaped in cross section, as the collection zones, the air-tight chamber being provided with the at least two removal devices, wherein each of the ring-shaped channels of the separating elements is connected to one of the removal devices via drainage channels passing laterally through the common wall.

2. The arrangement for producing structured substrates according to claim 1, wherein the collecting device is formed movable relative to the rotating holder so that depending on the movement different collection zones for collecting the spun-off liquid materials become operational.

3. The arrangement for producing structured substrates according to claim 1, wherein the collecting device with the plurality of ring-shaped channels, which are wedge-shaped in cross section and form the collection zones, is configured to be movable.

4. The arrangement for producing structured substrates according to claim 1, wherein the plurality of ring-shaped channels are formed solely by the separating elements and the common wall of the collecting device.

5. The arrangement for producing structured substrates according to claim 4, wherein the common wall has a form of a hollow cylinder or a hollow cone.

6. The arrangement for producing structured substrates according to claim 1, wherein the separating elements are substantially parallel to one another.

7. The arrangement for producing structured substrates according to claim 1, wherein the air-tight chamber including the collecting device and rotating holder for applying the liquid materials is surrounded by a gas-tight housing.

8. The arrangement for producing structured substrates according to claim 7, wherein the air-tight chamber for applying the liquid materials is filled with a dehumidified inert gas.

9. The arrangement for producing structured substrates according to claim 1, wherein the at least two removal devices are separate from the air-tight chamber for applying the liquid materials and convey the liquid materials collected in the collecting device selectively into separate storage containers, and wherein the storage containers are suitable for storing degassed and/or dehumidified liquid materials or photopolymer solutions.

10. The arrangement for producing structured substrates according to claim 9, wherein one of the storage containers is made of V4A steel or glass and connected via a gas-tight transport line to the collecting device and one of the removal devices.

11. The arrangement for producing structured substrates according to claim 1, wherein the at least one liquid supply line and/or the removal devices are provided with storage containers with at least one degassing device and with at least one dehumidifying device.

12. The arrangement for producing structured substrates according to claim 11, wherein the degassing device has a degassing supply line for inert gas, molecular nitrogen, a noble gas, helium, neon, or argon, and a sieve, disposed in a bottom area of the storage containers, with openings through which inert gas or dried gas flows for degassing and for dehumidifying of the liquid materials or photopolymer solutions.

13. The arrangement for producing structured substrates according to claim 12, wherein the degassing supply line is provided with a molecular sieve or manganese dioxide or limonite filters for dehumidifying the inert gas flowing therethrough.

14. The arrangement for producing structured substrates according to claim 1, wherein a filter for particle filtration is provided downstream of the collecting device.

15. An arrangement for producing structured substrates with a device for applying layer systems to a substrate, the arrangement comprising:
   a closed chamber having at least one supply line for liquid materials to the chamber for applying the liquid materials to form a layer system;
   a rotating holder for substrates; and
   a collecting device surrounding the rotating holder and arranged in the closed chamber, the collecting device adapted to collect liquid materials spun off of the substrate,
   wherein the collecting device has at least two removal devices configured to remove the collected liquid materials selectively individually or in batches,
   wherein the collecting device in the chamber surrounds the rotating holder in a ring-shaped manner and has at least two collection zones separated from one another by separating elements to collect the spun-off liquid materials,
   wherein the collecting device has at least two wall-shaped separating elements on a side facing the holder, which form at least two ring-shaped channels as the collection zones, which are provided with one or more removal devices,
   wherein a removal device is provided, separate from the chamber for applying the liquid materials, which conveys the liquid materials collected in the collecting device via the removal devices selectively into separate storage containers, and wherein the storage containers are suitable for storing degassed and/or dehumidified liquid materials or photopolymer solutions, and
   wherein a vacuum distillation device is provided, which separates the liquid materials in the different storage containers by distillation into its components water, solvents, liquid materials, or the photopolymer solutions, and transfers the separated components into gas-tight reservoirs, whereby these are provided particularly with an inert gas atmosphere.

16. The arrangement for producing structured substrates according to claim 7, wherein the housing is made of V4A steel or glass.

* * * * *